United States Patent
Ha et al.

(10) Patent No.: US 11,205,766 B2
(45) Date of Patent: Dec. 21, 2021

(54) DISPLAY DEVICE

(71) Applicant: Samsung Display Co., Ltd., Yongin-si (KR)

(72) Inventors: Jaeheung Ha, Suwon-si (KR); Jongwoo Kim, Hwaseong-si (KR); Byoungduk Lee, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 112 days.

(21) Appl. No.: 16/803,200

(22) Filed: Feb. 27, 2020

(65) Prior Publication Data
US 2020/0280023 A1 Sep. 3, 2020

(30) Foreign Application Priority Data

Feb. 28, 2019 (KR) .......................... 10-2019-0024168
Aug. 23, 2019 (KR) .......................... 10-2019-0103375

(51) Int. Cl.
*H01L 51/52* (2006.01)
*H01L 51/50* (2006.01)

(52) U.S. Cl.
CPC ........ *H01L 51/5253* (2013.01); *H01L 51/502* (2013.01); *H01L 2251/303* (2013.01)

(58) Field of Classification Search
CPC ........... H01L 51/5253; H01L 2251/558; H01L 2251/55; H01L 51/5275
See application file for complete search history.

(56) References Cited

U.S. PATENT DOCUMENTS

| | | | |
|---|---|---|---|
| 6,268,695 | B1 | 7/2001 | Affinito |
| 6,497,598 | B2 | 12/2002 | Affinito |
| 6,522,067 | B1 | 2/2003 | Graff et al. |
| 8,772,824 | B2 | 7/2014 | Lee et al. |
| 9,627,647 | B2 | 4/2017 | Kim et al. |
| 10,062,865 | B2 | 8/2018 | Lee et al. |
| 2016/0064691 | A1 | 3/2016 | Lee et al. |
| 2018/0158879 | A1 | 6/2018 | Kim et al. |

FOREIGN PATENT DOCUMENTS

| | | |
|---|---|---|
| KR | 10-2015-0012125 A | 2/2015 |
| KR | 10-2016-0036722 A | 4/2016 |
| KR | 10-2016-0150257 A | 12/2016 |
| KR | 10-2017-0120062 A | 10/2017 |
| KR | 10-2018-0007723 A | 1/2018 |

*Primary Examiner* — Anthony Ho
(74) *Attorney, Agent, or Firm* — Lewis Roca Rothgerber Christie LLP

(57) ABSTRACT

A display device includes a light emitting element, and a sealing member on the light emitting element and sealing the light emitting element, wherein the sealing member includes a first inorganic layer on the light emitting element, an organic layer on the first inorganic layer, and a second inorganic layer on the organic layer.

28 Claims, 14 Drawing Sheets

DISPLAY DEVICE

CROSS-REFERENCE TO RELATED APPLICATION

This application claims priority to and the benefit of Korean Patent Application No. 10-2019-0024168, filed on Feb. 28, 2019, and Korean Patent Application No. 10-2019-0103375, filed on Aug. 23, 2019, the entire contents of both of which are hereby incorporated by reference.

BACKGROUND

A display device is a device for displaying an image. Various display devices are being developed which are used in multimedia devices such as televisions, mobile phones, tablet computers, navigation devices, and gaming devices. In addition, in recent years, development of self-luminous display devices with increased light utilization efficiency and improved color balance is underway.

A self-luminous display device includes a light emitting element composed of an anode, a light emitting layer, and a cathode. The light emitting layer is very vulnerable to moisture or oxygen, so that when moisture or oxygen penetrates the light emitting layer from the outside, there is a problem that various defects such as dark spot and pixel shrinkage may occur due to deterioration of the light emitting layer, resulting in a sealing part for protecting the light emitting element being used to remedy such a problem.

SUMMARY

Aspects of embodiments of the present disclosure are directed to a display device having improved efficiency.

In addition, the present disclosure provides a display device that blocks foreign matter such as oxygen and moisture from flowing in the display device from the outside and has improved reliability.

According to some embodiments of the inventive concept, there is provided a display device including: a light emitting element; and a sealing member on the light emitting element and sealing the light emitting element, wherein the sealing member includes: a first inorganic layer on the light emitting element and having a refractive index of 1.58 to 1.64; an organic layer on the first inorganic layer; and a second inorganic layer on the organic layer and having a refractive index of 1.58 to 2.00.

In some embodiments, a thickness of the first inorganic layer is 0.5 µm to 1.5 µm.

In some embodiments, the first inorganic layer includes at least one of silicon oxynitride, silicon nitride, and silicon oxide.

In some embodiments, a thickness of the second inorganic layer is 0.5 µm to 1.5 µm.

In some embodiments, the second inorganic layer includes two or more sub inorganic layers having refractive indices different from each other.

In some embodiments, the second inorganic layer includes a first sub inorganic layer having a refractive index of 1.58 to 1.64, and a second sub inorganic layer having a refractive index of 1.80 to 2.00.

In some embodiments, a ratio of a thickness of the first sub inorganic layer to a thickness of the second sub inorganic layer is 3:1 to 5:1.

In some embodiments, the thickness of the first sub inorganic layer is 0.5 µm to 0.6 µm.

In some embodiments, the thickness of the second sub inorganic layer is 0.1 µm to 0.2 µm.

In some embodiments, the first sub inorganic layer includes silicon oxynitride or silicon oxide.

In some embodiments, the second sub inorganic layer includes at least one of silicon nitride, aluminum oxide, and titanium oxide.

In some embodiments, the second sub inorganic layer is at a top of the sealing member.

In some embodiments, the second inorganic layer includes silicon nitride that does not include a Si—O bond, and has a thickness of 0.15 µm to 0.25 µm.

In some embodiments, a hydrogen content of the second inorganic layer is less than or equal to $2.8 \times 10^{22}$ atom/cm$^3$.

In some embodiments, a molar ratio of nitrogen to silicon is 1 to 1.3 for an entirety of the second inorganic layer.

In some embodiments, the second inorganic layer has a density of 2.3 g/cm$^3$ to 2.6 g/cm$^3$.

In some embodiments, the light emitting element includes: a first electrode; a second electrode on the first electrode; and an intermediate layer between the first electrode and the second electrode, and includes a light emitting layer having at least one of an organic light emitting material and a quantum dot light emitting material.

In some embodiments, the display device further includes a capping layer between the light emitting element and the sealing member.

In some embodiments, the display device further includes a cover layer between the capping layer and the sealing member and has a refractive index of 1.3 to 1.4.

In some embodiments, the display device further includes a color control layer on the sealing member and includes a quantum dot.

According to some embodiments of the inventive concept, there is provided a display device including: a light emitting element; a first inorganic layer on the light emitting element and has a first thickness; an organic layer on the first inorganic layer; and a second inorganic layer on the organic layer, wherein the second inorganic layer includes a first sub inorganic layer having a second thickness less than the first thickness, and a second sub inorganic layer on the first sub inorganic layer and has a third thickness less than the second thickness.

In some embodiments, a ratio of the second thickness to the third thickness is 3:1 to 5:1.

In some embodiments, the first inorganic layer has a first refractive index, the first sub inorganic layer has a second refractive index, and the second sub inorganic layer has a third refractive index greater than the first refractive index and the second refractive index.

In some embodiments, the first refractive index is 1.58 to 1.64.

In some embodiments, the second refractive index is 1.58 to 1.64, and the third refractive index is 1.80 to 2.00.

According to some embodiments of the inventive concept, there is provided a display device including: a light emitting element; and a sealing member on the light emitting element and sealing the light emitting element, wherein the sealing member includes: a first inorganic layer; an organic layer on the first inorganic layer; and a second inorganic layer on the organic layer, and wherein the second inorganic layer includes silicon nitride that does not include a Si—O bond, has a thickness of 0.15 µm to 0.25 µm, has a molar ratio of nitrogen to silicon of 1 to 1.3 for an entirety of the second inorganic layer, and has a hydrogen content less than or equal to $2.8 \times 10^{22}$ atom/cm$^3$.

In some embodiments, the second inorganic layer has a density of 2.3 g/cm³ to 2.6 g/cm³.

In some embodiments, a refractive index of the first inorganic layer is 1.58 to 1.64, and a refractive index of the second inorganic layer is 1.58 to 2.00.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to describe principles of the inventive concept. In the drawings.

DETAILED DESCRIPTION

Figure 1A:
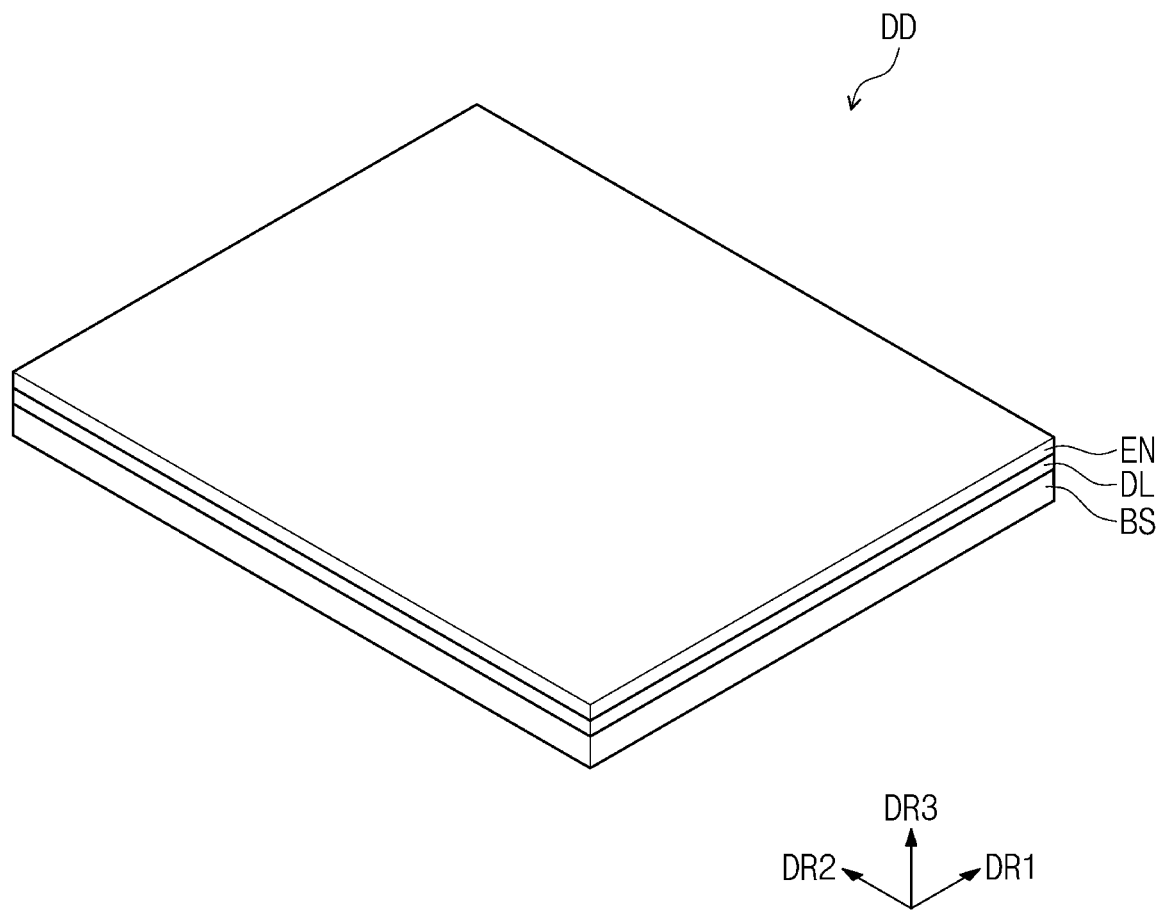
FIG. 1A is an assembled perspective view of a display device according to an example embodiment of the inventive concept.

Like reference numerals refer to like elements throughout this specification. In the figures, the thicknesses, ratios and dimensions of elements may be exaggerated for effective description of the technical contents.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 1B:
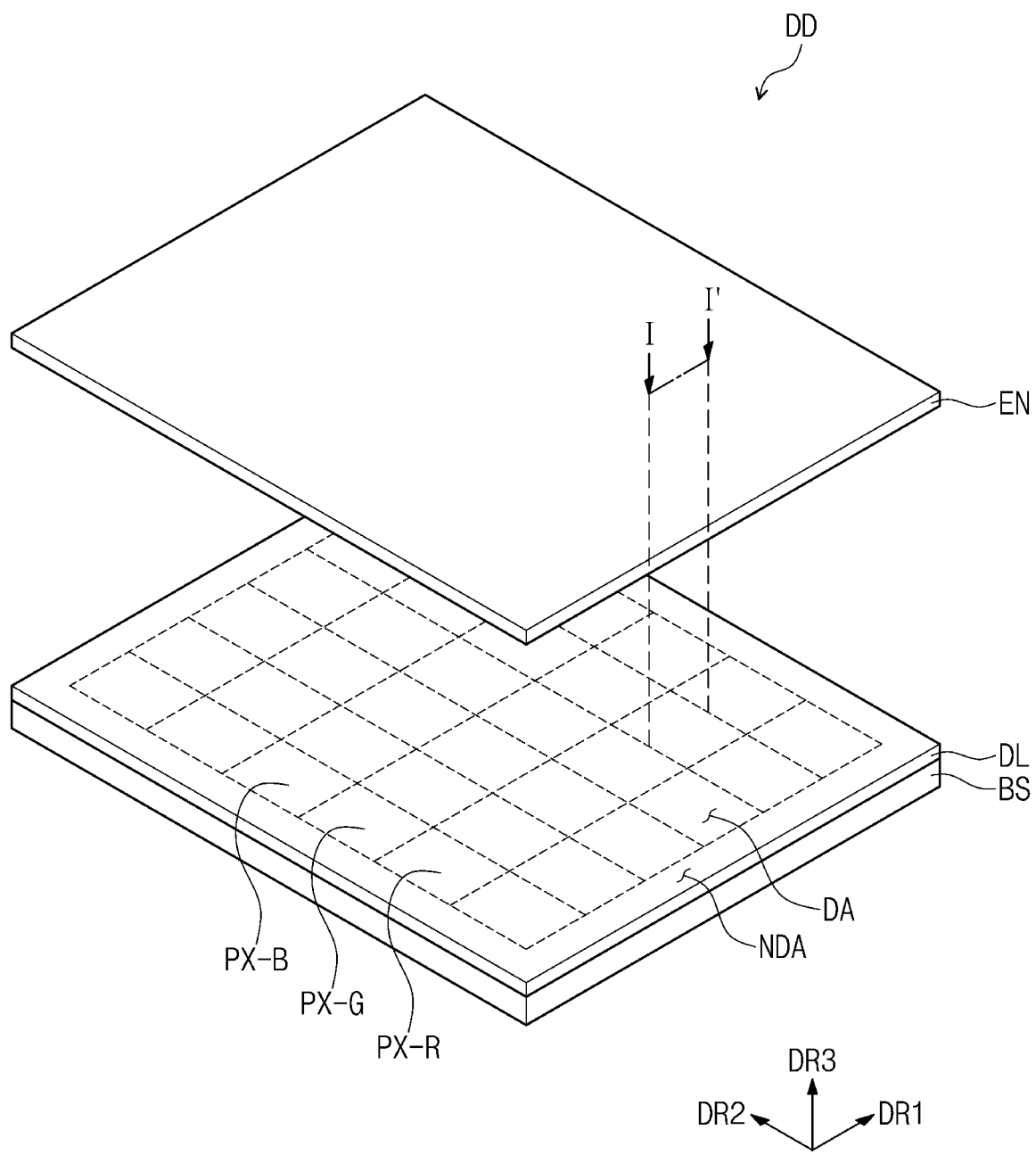
FIG. 1B is an exploded perspective view of the display device according to an example embodiment of the inventive concept.
Figure 2:
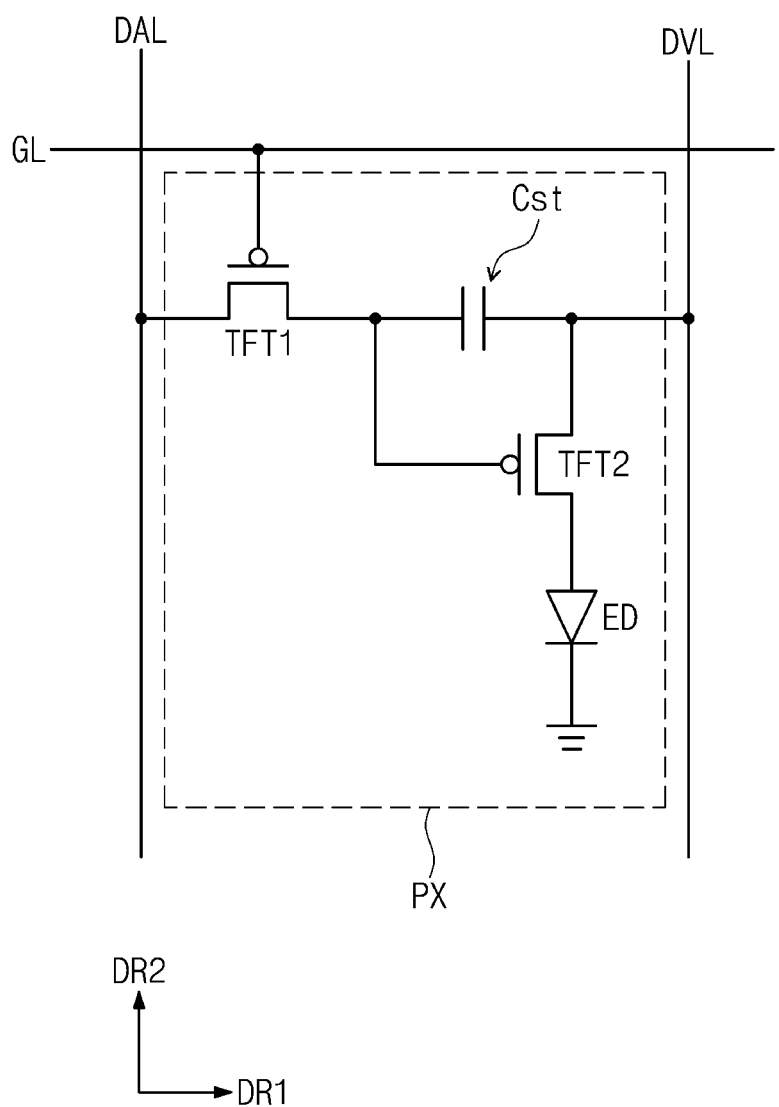
FIG. 2 is a circuit diagram of one of pixels included in the display device according to an example embodiment of the inventive concept.

FIG. 1A is an assembled perspective view of a display device according to an example embodiment of the inventive concept. FIG. 1B is an exploded perspective view of the display device according to an example embodiment of the inventive concept. FIG. 2 is a circuit diagram of one of pixels included in the display device according to an example embodiment of the inventive concept.

Referring to FIGS. 1A and 1B, a display device DD according to an embodiment of the inventive concept includes a base member BS, a display layer DL disposed on the base member BS, and a sealing member EN disposed on the display layer DL.

The display device DD is illustrated to include a planar display surface in an embodiment, but is not limited thereto. The display device DD may also include a curved display surface or a stereoscopic display surface. A stereoscopic display surface includes a plurality of display regions indicating (e.g., illustrating) different spatial directions, and may also include, for example, a polygonal columnar display surface.

The display device DD according to an embodiment may be a rigid display device or a flexible display device. When the display device DD is a flexible display device, the display device DD may be a foldable display device.

The display device DD includes a display region DA and a non-display region NDA. The display region DA displays an image. The display region DA may have a substantially rectangular shape when viewed in a thickness direction of the display device DD, but is not limited thereto.

The display region DA includes a plurality of pixel regions PX-B, PX-G, and PX-R. The pixel regions PX-B, PX-G, and PX-R may be arranged in a matrix form. The pixel regions PX-B, PX-G, and PX-R may be defined by a pixel defining film PDL (see FIG. 3). The pixel regions PX-B, PX-G, and PX-R may have pixels PX (see FIG. 2) disposed therein. Each of the pixels includes a light emitting element ED (see FIG. 2). In an embodiment of the inventive concept, the pixel may be a light emitting pixel or a transmissive pixel.

The display device DD may include a first pixel region, a second pixel region, and a third pixel region that emit light beams of wavelengths different from each other. In an embodiment illustrated in FIG. 1B, the first pixel region may be a blue pixel region PX-B, the second pixel region a green pixel region PX-G, and the third pixel region a red pixel region PX-R. That is, in an embodiment, the display device DD may include the blue pixel region PX-B, the green pixel region PX-G, and the red pixel region PX-R. The blue pixel region PX-B is a blue light emitting region that emits blue light, and the green pixel region PX-G and the red pixel region PX-R respectively represent a green light emitting region and a red light emitting region.

The non-display region NDA does not display an image (e.g., is not capable of displaying an image). When viewed in a thickness direction DR3 of the display device DD, the non-display region NDA may, for example, surround the display region DA. The non-display region NDA may be adjacent to the display region DA in a first direction DR1 and a second direction DR2.

Referring to FIG. 2, each of the pixels PX may be connected to a line part composed of a gate line GL, a data line DAL, and a driving voltage line DVL. Each of the pixels PX includes thin film transistors TFT1 and TFT2 connected to the line part, the light emitting element ED and a capacitor Cst connected to the thin film transistors TFT1 and TFT2.

The gate line GL extends in the first direction DR1. The data line DAL extends in the second direction DR2 crossing the gate line GL. The driving voltage line DVL extends in substantially the same direction as the data line DAL, that is, in the second direction DR2. The gate line GL transmits a scan signal to the thin film transistors TFT1 and TFT2, the data line DAL transmits a data signal to the thin film transistors TFT1 and TFT2, and the driving voltage line DVL provides a driving voltage to the thin film transistors TFT1 and TFT2.

The thin film transistors TFT1 and TFT2 may include a driving thin film transistor TFT2 for controlling the light emitting element ED and a switching thin film transistor TFT1 for switching the driving thin film transistor TFT2. Each of the pixels PX is described to include the two thin film transistors TFT1 and TFT2 in an embodiment of the inventive concept, but is not limited thereto. Each of the pixels PX may include a single thin film transistor and a single capacitor, or may also include three or more thin film transistors and two or more capacitors.

The switching thin film transistor TFT1 includes a first gate electrode, a first source electrode, and a first drain electrode. The first gate electrode is connected to the gate line GL, and the first source electrode is connected to the data line DAL. The first drain electrode is connected to a first common electrode by a contact hole (or contact opening). The switching thin film transistor TFT1 transmits the data signal applied to the data line DAL to the driving thin film transistor TFT2 in response to the scan signal applied to the gate line GL.

The light emitting element ED includes a first electrode connected to the driving thin film transistor TFT2, and a second electrode receiving a second power supply voltage. The light emitting element ED may include a light emitting pattern disposed between the first electrode and the second electrode.

The light emitting element ED emits light during a turn-on period of the driving thin film transistor TFT2. The color of light generated in the light emitting element ED is determined by a material that forms the light emitting pattern. For example, the color of light generated in the light emitting element ED may be any one of red, green, blue, and white.

Referring to FIGS. 1A and 1B again, the sealing member EN is disposed on the base member BS and the display layer DL. The sealing member EN covers the display layer DL. The sealing member EN protects the display layer DL from external oxygen, moisture, and contaminants. A detailed description of the sealing member EN will be provided below.

Figure 3:
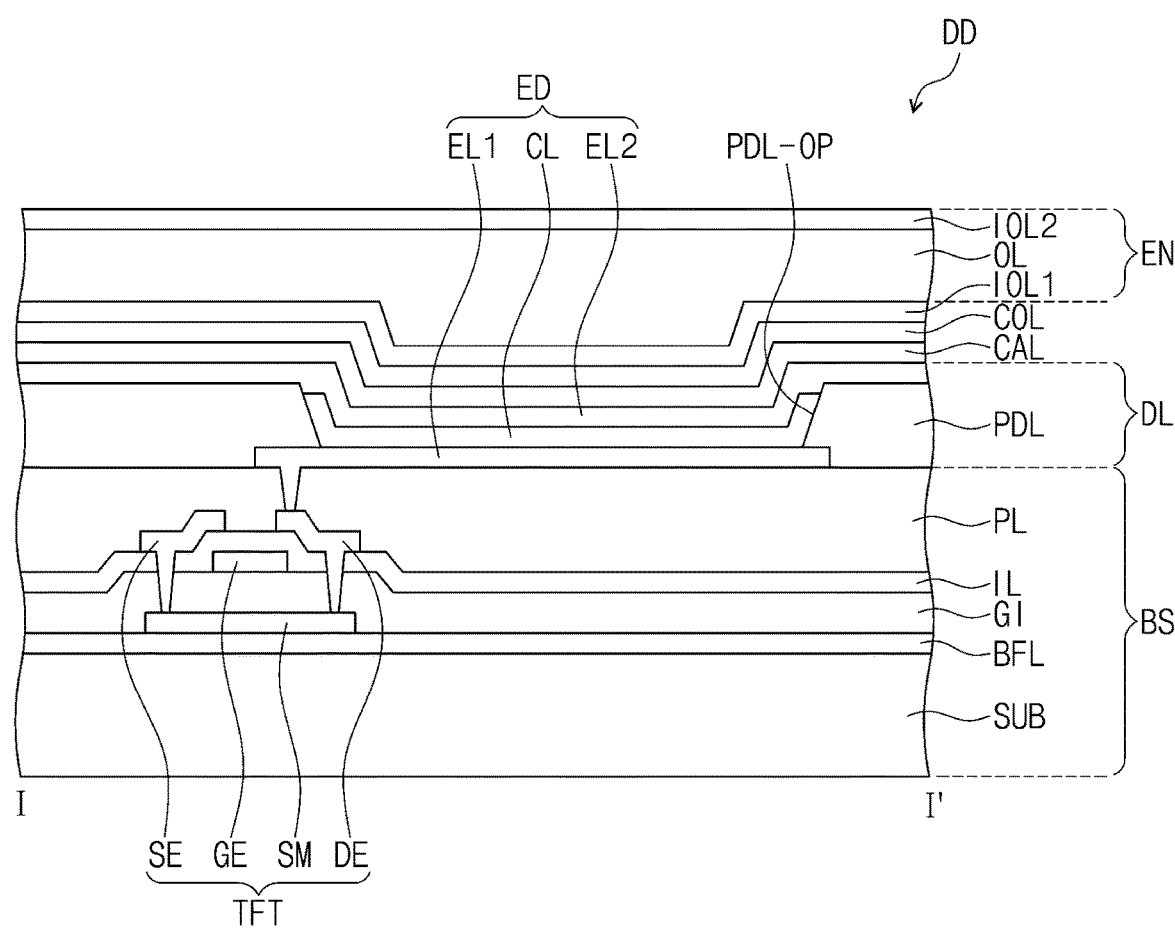
FIG. 3 is a cross-sectional view taken along the line I-I' illustrated in FIG. 1B.

FIG. 3 is a cross-sectional view taken along the line I-I' illustrated in FIG. 1B.

Referring to FIG. 3, the display device DD includes the base member BS, the display layer DL, a capping layer CAL, a cover layer COL, and the sealing member EN. The base member BS may include a base layer SUB, a buffer layer BFL, a thin film transistor TFT, and the like.

The base layer SUB is not particularly limited as long as the base layer SUB is formed of a commonly used material, and may be formed of an insulating material such as glass, plastic, and quartz. Examples of an organic polymer constituting the base layer SUB may include polyethylene terephthalate (PET), polyethylene naphthalate (PEN), polyimide, and polyether sulfone. A material forming the base layer SUB may be selected in consideration of mechanical strength, thermal stability, transparency, surface smoothness, ease of handling, waterproofness, and the like.

A functional layer may be disposed on the base layer SUB. The buffer layer BFL is exemplarily illustrated to be disposed as the functional layer in FIG. 3, but the functional layer may also include a barrier layer. The buffer layer BFL may function to improve bonding force between the base member BS and the display layer DL, and the barrier layer may function to prevent or substantially prevent foreign matter from flowing into the display layer DL.

The thin film transistor TFT may be disposed on the buffer layer BFL. The thin film transistor TFT may include the driving thin film transistor for controlling the light emitting element ED and the switching thin film transistor for switching the driving thin film transistor.

The thin film transistor TFT may include a semiconductor layer SM, a gate electrode GE, a source electrode SE, and a drain electrode DE. The semiconductor layer SM is formed of a semiconductor material and operates as an active layer of the thin film transistor TFT. The semiconductor layer SM may be formed of an inorganic semiconductor or an organic semiconductor.

A gate insulating layer GI is provided on the semiconductor layer SM. The gate insulating layer GI covers the semiconductor layer SM. The gate insulating layer GI may include at least one of an organic insulating material and an inorganic insulating material.

The gate electrode GE is provided on the gate insulating layer GI. The gate electrode GE may be formed so as to cover a region corresponding to a channel region of the semiconductor layer SM.

The source electrode SE and the drain electrode DE are provided on an interlayer insulating layer IL. The drain electrode DE may come in contact with a drain region of the semiconductor layer SM through a contact hole (or contact opening) formed in the gate insulating layer GI and the interlayer insulating layer IL, and the source electrode SE may come in contact with a source region of the semiconductor layer SM through a contact hole (or contact opening) formed in the gate insulating layer GI and the interlayer insulating layer IL.

A passivation layer PL is provided on the source electrode SE, the drain electrode DE, and the interlayer insulating layer IL. The passivation layer PL may serve as a protective film for protecting the thin film transistor TFT, and may also serve as a planarization film for planarizing a top surface thereof.

The display layer DL may include the light emitting element ED and the pixel defining film PDL.

The light emitting element ED is provided on the passivation layer PL. The light emitting element ED includes a first electrode EL1, a second electrode EL2 disposed on the first electrode EL1, and an intermediate layer CL disposed between the first electrode EL1 and the second electrode EL2. The light emitting element ED may be of a top emission type. However, the light emitting element ED is not limited thereto, and may also be of a bottom emission type.

The first electrode EL1 may be a pixel electrode or an anode. The first electrode EL1 may be a transmissive electrode, a transflective electrode, or a reflective electrode. When the first electrode EL1 is a transmissive electrode, the first electrode EL1 may include a transparent metal oxide such as indium tin oxide (ITO), indium zinc oxide (IZO), zinc oxide (ZnO), and indium tin zinc oxide (ITZO). When the first electrode EL1 is a transflective electrode or a reflective electrode, the first electrode EL1 may include Ag, Mg, Al, Pt, Pd, Au, Ni, Nd, Ir, Cr, or a mixture of the metals.

The second electrode EL2 may be a common electrode or a cathode. The second electrode EL2 may be a transmissive electrode, a transflective electrode, or a reflective electrode.

When the second electrode EL2 is a transmissive electrode, the second electrode EL2 may include Li, Ca, LiF/Ca, LiF/Al, Al, Mg, BaF, Ba, Ag, or a compound or mixture thereof (e.g., a mixture of Ag and Mg). However, the second electrode EL2 is not limited thereto, and may also include, for example, indium tin oxide (ITO), indium zinc oxide (IZO), zinc oxide (ZnO), or indium tin zinc oxide (ITZO). When the second electrode EL2 is a transflective electrode or a reflective electrode, the second electrode EL2 may include Ag, Mg, Al, Pt, Pd, Au, Ni, Nd, Ir, Cr, Li, Ca, LiF/Ca, LiF/Al, Mo, Ti, or a compound or mixture thereof (e.g., a mixture of Ag and Mg). Alternatively, the second electrode EL2 may be a structure of a plurality of layers including a reflective film or a transflective film formed of the above-described material, and a transparent conductive film formed of indium tin oxide (ITO), indium zinc oxide (IZO), zinc oxide (ZnO), indium tin zinc oxide (ITZO), or the like.

The pixel defining film PDL may be disposed on the first electrode EL1. For example, the pixel defining film PDL may cover a portion of the first electrode EL1, and expose another portion thereof. The pixel defining film PDL may include a metal-fluoride ion compound, although not limited thereto. For example, the pixel defining film PDL may be composed of any one metal-fluoride ion compound of LiF, $BaF_2$, and CsF. A metal-fluoride ion compound has insulating properties when the metal-fluoride ion compound has a set or predetermined thickness.

The pixel defining film PDL may define an opening PDL-OP. The opening PDL-OP of the pixel defining film PDL may define a light emitting region.

The intermediate layer CL may be disposed between the first electrode EL1 and the second electrode EL2. The intermediate layer CL may be disposed in the opening PDL-OP defined in the pixel defining film PDL. The intermediate layer CL may overlap the light emitting region defined by the opening PDL-OP of the pixel defining film PDL. The intermediate layer CL will be described in more detail with reference to FIG. 4A to be described later.

The sealing member EN includes a first inorganic layer IOL1, an organic layer OL, and a second inorganic layer IOL2. However, the sealing member EN is not limited thereto, and may further include an inorganic layer and an organic layer. The sealing member EN is disposed on the light emitting element ED and seals the light emitting element ED.

The first inorganic layer IOL1 is disposed on the display layer DL. The first inorganic layer IOL1 is disposed on the light emitting element ED. For example, the first inorganic layer IOL1 may be disposed closer to the light emitting element ED than the second inorganic layer IOL2. The first inorganic layer IOL1 may be disposed in contact with the second electrode EL2 of the light emitting element ED. The first inorganic layer IOL1 may be disposed to overlap the light emitting element ED and the pixel defining film PDL. The first inorganic layer IOL1 may include an inorganic material. The first inorganic layer IOL1 may be formed by a deposition method or the like, and may be formed using, for example, plasma-enhanced chemical vapor deposition (PECVD). The first inorganic layer IOL1 may seal the light emitting element ED, and function as a barrier film for preventing or substantially preventing foreign matter from flowing into the light emitting element ED.

The organic layer OL is disposed on the first inorganic layer IOL1. The organic layer OL may be disposed directly on the first inorganic layer IOL1. The organic layer OL has a set or predetermined thickness, may serve as a protective film for protecting the light emitting element ED, may relieve internal stress of the sealing member EN, and may serve as a planarization film for planarizing a top surface of the first inorganic layer IOL1. The organic layer OL may include an organic material and may include, for example, an acrylic resin, an epoxy resin, polyimide, and polyethylene, but is not limited thereto. The refractive index of the organic layer OL including the organic material described above may be about 1.35 to about 1.55. The organic layer OL may be formed by a deposition method, a coating method, or the like.

The second inorganic layer IOL2 is disposed on the organic layer OL. The second inorganic layer IOL2 may be disposed directly on the organic layer OL. The second inorganic layer IOL2 may be disposed to overlap the light emitting element ED and the pixel defining film PDL. The second inorganic layer IOL2 may completely overlap the first inorganic layer IOL1 from a plan view. The second inorganic layer IOL2 includes an inorganic material. The second inorganic layer IOL2 may include an inorganic material the same as or different from that included in the first inorganic layer IOL1. The second inorganic layer IOL2 may be formed by a deposition method or the like, and may be formed using, for example, plasma-enhanced chemical vapor deposition (PECVD) or inductively coupled plasma chemical vapor deposition (ICPCVD). The second inorganic layer IOL2 may seal the light emitting element ED, and function as a barrier film for preventing or substantially preventing foreign matter from flowing into the light emitting element ED.

The display device DD may further include the capping layer CAL. The capping layer CAL may be disposed between the light emitting element ED and the sealing member EN. The capping layer CAL may be disposed to cover the second electrode EL2. The capping layer CAL may be disposed between the second electrode EL2 and the first inorganic layer IOL1.

The capping layer CAL may have light transmission properties and serve to protect the light emitting element ED. Additionally, the capping layer CAL may serve to help light generated in a light emitting layer be efficiently emitted to the outside. The capping layer CAL may include at least one of an inorganic material and an organic material having light transmission properties. In addition, the capping layer CAL may also be formed of two or more materials having refractive indices different from each other. For example, the capping layer CAL may be formed by mixed use of a high refractive index material and a low refractive index material. The high refractive index material and the low refractive index material may be an organic material or an inorganic material. The thickness of the capping layer CAL is not particularly limited, and may be, for example, from about 30 nm to about 1000 nm.

The display device DD may further include the cover layer COL. The cover layer COL may be disposed between the light emitting element ED and the sealing member EN. Further, the cover layer COL may be disposed between the capping layer CAL and the sealing member EN. The refractive index of the cover layer COL may be from about 1.3 to about 1.4. The cover layer COL may serve to help light generated in the light emitting layer be efficiently emitted to the outside. A material included in the cover layer COL is not particularly limited and may include, for example, lithium fluoride (LiF).

Figure 4A:
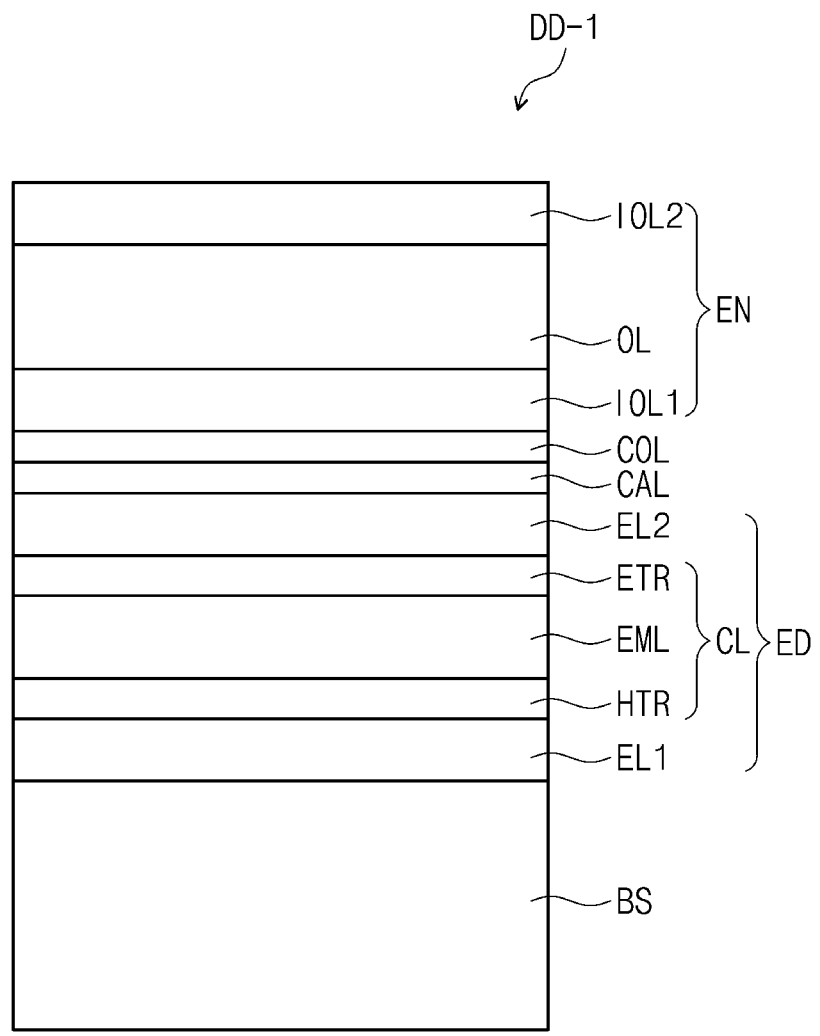
FIG. 4A is a cross-sectional view of a display device according to an example embodiment of the inventive concept.
Figure 4B:
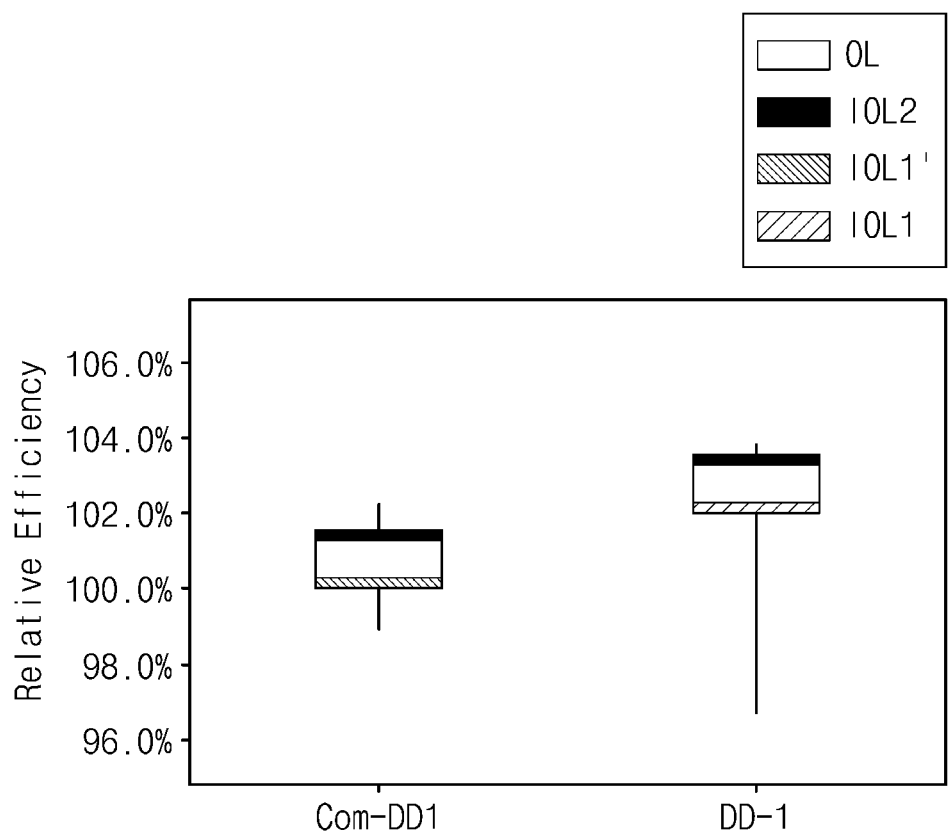
FIG. 4B is a graph showing efficiency of the display device according to an example embodiment of the inventive concept and a display device of a comparative example, each of which include a blue light emitting layer.
Figure 4C:
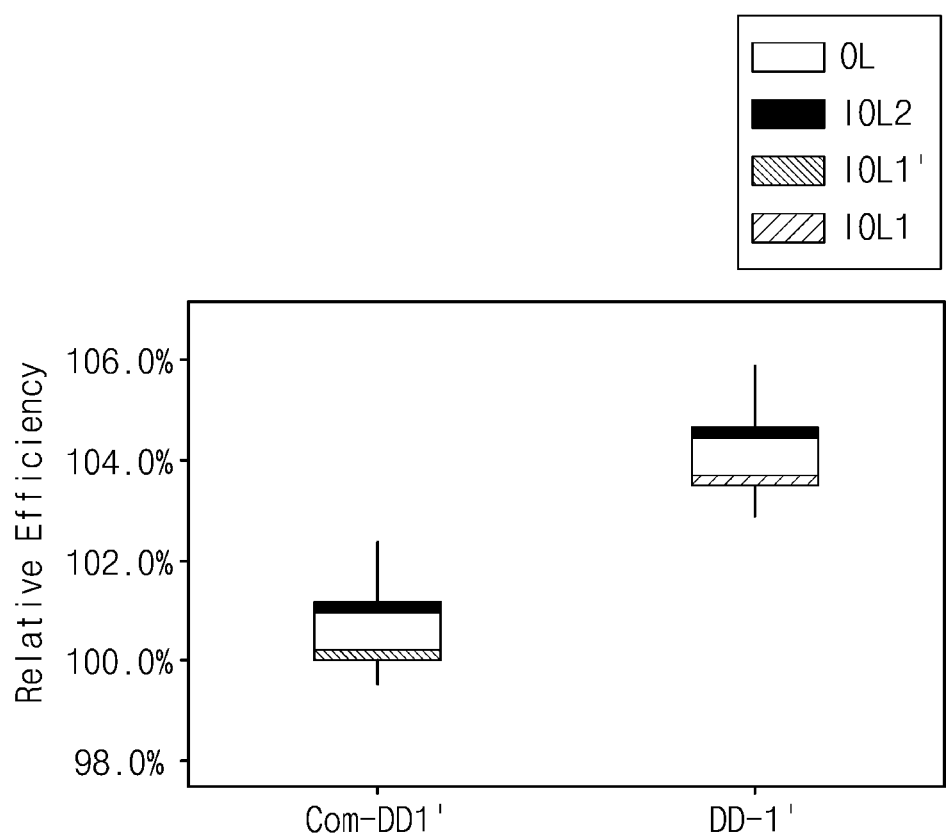
FIG. 4C is a graph showing efficiency of a display device according to an example embodiment of the inventive concept and a display device of a comparative example, each of which include a white light emitting layer.

FIG. 4A is a cross-sectional view of a display device DD-1 according to an example embodiment of the inventive concept, and FIGS. 4B and 4C are graphs showing relative efficiency of the display device DD-1 and a display device DD-1' according to an example embodiment of the inventive concept and display devices Com-DD1 and Com-DD1' of a comparative example.

The base member BS is schematically illustrated in FIG. 4A when compared with FIG. 3. Hereinafter, a detailed description will not be provided for components that are the same as that of the display device described with reference to FIGS. 1 to 3.

Referring to FIG. 4A, the intermediate layer CL may include a light emitting layer EML. The light emitting layer EML may emit light of any one of red, green, blue, and white. The light emitting layer EML may be a single layer. Further, the light emitting layer EML may have a multilayer structure referred to as a tandem. For example, the light emitting layer EML may be a two-layer tandem structure of a blue light emitting layer/a blue light emitting layer, a blue light emitting layer/a yellow light emitting layer, a blue light emitting layer/a green light emitting layer, or the like, or a three-layer tandem structure of a blue light emitting layer/a blue light emitting layer/a blue light emitting layer, a blue light emitting layer/a yellow light emitting layer/a blue light emitting layer, a blue light emitting layer/a green light emitting layer/a blue light emitting layer, or the like. Further, an electric charge generation layer may further be included in each of positions between the light emitting layers.

The light emitting layer EML may include a light emitting material. The kind of the light emitting material is not particularly limited, and may be an organic compound and/or an inorganic compound. In an embodiment, the light emitting material may be a quantum dot material. The core of quantum dot may be selected from a Group II-VI compound, a Group III-V compound, a Group IV-VI compound, a Group IV element, a Group IV compound, and a combination thereof.

A plurality of common layers other than the light emitting layer may further be disposed in the intermediate layer CL. For example, the intermediate layer CL may be formed by sequentially laminating a hole transport region HTR, the light emitting layer EML, and an electron transport region ETR. The hole transport region HTR is provided on the first electrode EL1, and may include at least one of a hole injection layer, a hole transport layer, a hole buffer layer, and an electron blocking layer. The electron transport region ETR is provided on the light emitting layer EML, and may include at least one of a hole blocking layer, an electron transport layer, and an electron injection layer.

The sealing member EN includes the first inorganic layer IOL1, the organic layer OL disposed directly on the first inorganic layer IOL1, and the second inorganic layer IOL2 disposed directly on the organic layer OL.

In an embodiment, the refractive index of the first inorganic layer IOL1 may be about 1.64 or smaller. When the refractive index of the first inorganic layer IOL1 is greater than about 1.64, a difference in refractive index between the first inorganic layer IOL1 and the organic layer OL becomes large, and thus the ratio of light experiencing interface reflection between the first inorganic layer IOL1 and the organic layer OL to light emitted from the light emitting layer EML may increase. Accordingly, the microcavity effect of the light emitting element is affected and the efficiency of the display device DD-1 is reduced.

Referring to FIGS. 4B and 4C, the difference in light efficiency of the display devices according to the refractive index of the first inorganic layer IOL1 may be seen. The efficiency of the display device DD-1 is evaluated by measuring a current-voltage-luminance (IVL) characteristic. The comparative example and the embodiment have the same structure as the display device DD-1 according to FIG. 4A except that the refractive indices of the first inorganic layer IOL1 of the sealing member EN are different from each other. In the graph, the same structure is omitted and only the structure of the sealing member is shown. For example, the display devices Com-DD1 and Com-DD1' of the comparative example include a sealing member including a first inorganic layer IOL1' having silicon oxynitride and a refractive index of about 1.76, the organic layer OL, and a second inorganic layer IOL2 having a refractive index of about 1.90, and the display devices DD-1 and DD-1' of an embodiment include a sealing member including a first inorganic layer IOL1 having silicon oxynitride and a refractive index of about 1.60, the organic layer OL, and a second inorganic layer IOL2 having a refractive index of about 1.90.

FIG. 4B is a graph showing relative light efficiency when the display devices include a blue light emitting layer. When the efficiency of the display device Com-DD1 of the comparative example is taken as 100%, the display device DD-1 according to an embodiment has an efficiency of about 102%, about 2% higher when compared with the display device of the comparative example. FIG. 4C is a graph showing relative light efficiency when the display devices include a white light emitting layer. When the efficiency of the display device Com-DD1' of the comparative example is taken as 100%, the display device DD-1' according to an embodiment has an efficiency of about 103.5%, about 3.5% higher when compared with the display device of the comparative example. It is considered that the efficiency of the display device is improved as the refractive index of the first inorganic layer IOL1 is lowered to reduce interface reflection between the first inorganic layer IOL1 and the organic layer OL. Accordingly, the efficiency of the display devices DD, DD-1, and DD-1' according to an embodiment of the inventive concept may be improved by controlling the refractive index of the first inorganic layer IOL1 to be about 1.64 or smaller.

Further, in an embodiment, the refractive index of the first inorganic layer IOL1 may be about 1.58 or greater. When the refractive index of the first inorganic layer IOL1 is less than about 1.58, the function of the first inorganic layer IOL1 as a barrier film deteriorates, so that oxygen, moisture, foreign matter, and the like may not be properly prevented from flowing into the light emitting element ED. In particular, as a result of a wet high temperature storage (WHTS) measurement test, a large number of dark spots or the like have been generated and the display device has been evaluated to be defective or unusable when the refractive index of the first inorganic layer IOL1 is less than about 1.58, but the display device has been evaluated to be good when the refractive index of the first inorganic layer IOL1 is about 1.58 or greater. Here, the WHTS measurement test is a storage test in a high temperature and high humidity condition, which means that a display device is placed in an oven at a temperature of about 85° C. and a humidity of about 85% for about 500 hours so as to qualitatively evaluate whether a dark spot appears, or the like. Accordingly, by controlling the refractive index of the first inorganic layer IOL1 to be about 1.58 or greater, the first inorganic layer IOL1 may effectively function as the barrier film, resulting in improved reliability of the display devices DD, DD-1, and DD-1' according to an embodiment of the inventive concept.

In an embodiment, the thickness of the first inorganic layer IOL1 may be from about 0.5 µm to about 1.5 µm. The thickness of the first inorganic layer IOL1 may be greater than or equal to that of the second inorganic layer IOL2. In another embodiment, the thickness of the first inorganic layer IOL1 may be from about 0.7 µm to about 1.2 µm.

In an embodiment, the first inorganic layer IOL1 may include an inorganic material having a relatively small absorption coefficient, and may include at least one of, for example, silicon oxynitride (SiON), silicon nitride (SiN), and silicon oxide (SiO), but is not limited thereto. By adjusting a thickness range of the first inorganic layer IOL1 and including an inorganic material having a relatively small absorption coefficient in the first inorganic layer IOL1, the amount of light absorbed by the first inorganic layer IOL1 may be minimized or substantially reduced while the first inorganic layer IOL1 may effectively perform the function of the barrier film, so that the decrease in the efficiency of the display devices DD, DD-1, and DD-1' may be prevented or substantially reduced.

In an embodiment, the thickness of the organic layer OL may be from about 0.5 µm to about 1.3 µm. The organic layer OL may be a single layer, or may include a plurality of layers.

In an embodiment, the refractive index of the second inorganic layer IOL2 may be from about 1.58 to about 2.00. In an embodiment, the thickness of the second inorganic layer IOL2 may be from about 0.1 µm to about 1.5 µm. In another embodiment, the thickness of the second inorganic layer IOL2 may be from about 0.1 µm to about 1.0 µm. The second inorganic layer IOL2 may be a single layer, or may include a plurality of sub inorganic layers. When the second inorganic layer IOL2 includes the plurality of sub inorganic layers, the refractive indices and/or the thicknesses of the sub inorganic layers may be, within the ranges, the same or different from each other, and a detailed description will be provided below.

Referring back to FIG. 4A, when the second inorganic layer IOL2 is a single layer in an embodiment, the thickness of the second inorganic layer IOL2 may be from about 0.15 µm to about 0.25 µm, and more preferably, from about 0.15 µm to about 0.2 µm. The second inorganic layer IOL2 may include silicon nitride ($SI_xN_y$, where x and y are independent of each other and are each an integer of 1 to 5). For example, the second inorganic layer IOL2 may be constituted of silicon nitride such as $Si_3N_4$.

Silicon nitride may not contain a Si—O (silicon-oxygen) bond. In addition, a hydrogen content per unit volume ($cm^3$) in silicon nitride may be from about 0 atom/$cm^3$ to about $2.8 \times 10^{22}$ atom/$cm^3$. The molar ratio of nitrogen to silicon in silicon nitride may be from about 1 to about 1.3.

When silicon nitride satisfies the conditions described above, the absorption coefficient of silicon nitride for light having a center wavelength of about 460 nm may converge to zero. Accordingly, because an amount of blue light absorbed by the second inorganic layer IOL2 after the blue light has been emitted from the light emitting layer EML is reduced, the light emission efficiency of the display device DD may be improved for blue light.

When the second inorganic layer IOL2 includes silicon nitride that satisfies the conditions described above, the density of the second inorganic layer IOL2 may be from about 2.3 g/$cm^3$ to about 2.6 g/$cm^3$. Accordingly, the second inorganic layer IOL2 may have excellent barrier properties and more effectively prevent moisture from permeating from the outside.

When the thickness of the second inorganic layer IOL2 is from about 0.15 µm to about 0.25 µm, damage to the sealing member EN may be prevented or substantially reduced even when the sealing member EN is applied to a foldable display device and folded several times. Accordingly, permeation of external moisture due to damage to the sealing member EN is prevented or substantially prevented, so that the durability of the display device DD may be improved. The moisture resistance of the sealing member EN may decrease when the thickness of the second inorganic layer IOL2 is less than about 0.15 µm, and, when the thickness of the second inorganic layer IOL2 exceeds about 0.25 µm, the durability of the sealing member EN may deteriorate in the case that the sealing member EN is applied to a foldable display device.

Hereinafter, the effects of the second inorganic layer IOL2 according to an embodiment of the inventive concept and the display device DD including the same will be described in detail with reference to Embodiments and Comparative Examples.

Display devices of Embodiment 1 and Comparative Example 1 have the same laminated structure as the display device DD-1 illustrated in FIG. 4A. The display devices of Embodiment 1 and Comparative Example 1 are manufactured of the same materials and structure, except for the second inorganic layer.

In the display device of Embodiment 1, silicon nitride has been deposited to form a second inorganic layer having a thickness of about 0.2 µm. In the display device of Comparative Example 1, silicon nitride has been deposited to form a second inorganic layer having a thickness of about 0.7 µm.

Properties of the second inorganic layers of Embodiment 1 and Comparative Example 1 are shown in Table 1 below.

TABLE 1

| Analysis Item | Embodiment 1 | Comparative Example 1 |
|---|---|---|
| Absorption Coefficient ($M^{-1}cm^{-1}$) | 0 | $4.8 \times 10^{-3}$ |
| Si—O Bond | none | present |
| Hydrogen Content (atom/$cm^3$) | $2.58 \times 10^{22}$ | $3.24 \times 10^{22}$ |
| Component Ratio (N/$Si^{2p}$) | 49.86/48.50 | 47.94/50.50 |
| Density | 2.520 g/$cm^3$ | 2.101 g/$cm^3$ |

When the second inorganic layers according to Embodiment 1 and Comparative Example 1 have been measured using Fourier transform infrared spectroscopy, a peak corresponding to a Si—O bond has not been detected in the second inorganic layer of Embodiment 1, and a peak corresponding to a Si—O bond has been detected in the second inorganic layer of Comparative Example 1. Accordingly, it may be seen that the second inorganic layer of Embodiment 1 does not contain a Si—O bond. A hydrogen content of the second inorganic layers of Embodiment 1 and Comparative Example 1 has been measured using dynamic secondary ion mass spectrometry (D-SIMS).

Molar percentages of nitrogen and silicon in the second inorganic layers of Embodiment 1 and Comparative Example 1 have been measured using X-ray photoelectron spectroscopy (XPS). $Si^{2p}$ is a measured number of moles of 2p orbital of silicon (Si). The molar percentages of nitrogen and silicon in the second inorganic layer of Embodiment 1 have been about 49.86% and about 48.50% respectively, and thus the molar ratio of nitrogen to silicon in the second inorganic layer of Embodiment 1 has been measured to be about one or greater. The molar percentages, measured by the same method, of nitrogen and silicon in the second inorganic layer of Comparative Example 1 have been about 47.94% and about 50.50% respectively, and thus the molar ratio of nitrogen to silicon in the second inorganic layer of Comparative Example 1 has been measured to be about one or smaller.

The densities of the second inorganic layers of Embodiment 1 and Comparative Example 1 have been measured using X-ray reflectometry.

The absorption coefficients of the second inorganic layers of Embodiment 1 and Comparative Example 1 have been measured with blue light having a center wavelength of about 460 nm.

The refractive index of the second inorganic layers of Embodiment 1 and Comparative Example 1 has been about 1.9.

Moisture vapor transmission rate (MVTR) values have been measured for the display devices of Embodiment 1 and Comparative Example 1. MVTR measurement results are shown in Table 2 below.

TABLE 2

|  | Embodiment 1 | Comparative Example 1 |
|---|---|---|
| MVTR (g/m$^2$ day) | $2.0 \times 10^{-6}$ | $3.1 \times 10^{-6}$ |

The display device according to Embodiment 1 is thinner than that of Comparative Example 1, but has a lower moisture vapor transmission rate. The second inorganic layer of Embodiment 1 does not contain a Si—O bond, has a molar ratio of nitrogen to silicon of about one or greater, has a small hydrogen content of about $2.8 \times 10^{22}$ atom/cm$^3$ or smaller, and has a density higher than that of the second inorganic layer of Comparative Example 1. As a result, it is considered that the second inorganic layer of Embodiment 1 has excellent barrier properties and thus exhibits a low moisture vapor transmission rate. To measure the light durability of the display device according to an embodiment, amounts of change in light transmittance according to the degree of exposure to light have been measured for display devices according to Embodiments and Comparative Examples, and the measurement results are shown in Table 3. The amounts of change in light transmittance have been measured by the following method.

Amounts 1 of change in light transmittance are values of two measurements with deep blue light having a center wavelength of about 405 nm, and amounts 2 of change in light transmittance are values of two measurements with deep blue light having a center wavelength of about 430 nm.

A second inorganic layer having a thickness of about 2 μm has been deposited for each of Embodiment 2 and Comparative Example 2, a second inorganic layer having a thickness of about 4 μm has been deposited for each of Embodiment 3 and Comparative Example 3, and a second inorganic layer having a thickness of about 7 μm has been deposited for each of Embodiment 4 and Comparative Example 4. The properties of the second inorganic layers of Embodiments 2 to 4 are the same as the properties of the second inorganic layer of Embodiment 1 shown in Table 1, and the properties of the second inorganic layers of Comparative Examples 2 to 4 are the same as the properties of the second inorganic layer of Comparative Example 1 shown in Table 1.

The amounts of change in light transmittance according to the Embodiments and the Comparative Examples have been derived by measuring light transmittance before exposure to light and light transmittance after exposure to light for a total of 40 cycles to calculate percentages of change in light transmittance before and after exposure to light. During one cycle, each of the display devices has been exposed to light having an intensity of about 1120 Watt (W) for about eight hours.

The amount of change in light transmittance is expressed as a negative value when light transmittance increases, and the amount of change in light transmittance is expressed as a positive value when light transmittance decreases.

TABLE 3

|  | Amount 1 of Change in Light Transmittance (1st/2nd) (%) | Amount 2 of Change in Light Transmittance (1st/2nd) (%) |
|---|---|---|
| Embodiment 2 | −0.4/−0.2 | −0.3/−0.1 |
| Embodiment 3 | −0.1/0.0 | 0.1/0.1 |
| Embodiment 4 | 0.1/0.12 | 0.0/0.1 |
| Comparative Example 2 | 5.0/5.1 | 0.7/1.0 |
| Comparative Example 3 | 12.6/12.1 | 1.0/1.0 |
| Comparative Example 4 | 14.5/13.7 | 4.0/4.3 |

Referring to Table 3, there has been no substantial change in light transmittance even when the display devices of Embodiments 2 to 4 have been exposed to light. For Comparative Examples 2 to 4, light transmittance has decreased after the display devices have been exposed to light, light transmittance for light having a center wavelength of about 405 nm has particularly decreased remarkably, and light transmittance has further decreased as the thickness of the second inorganic layers has increased. In addition, referring to Comparative Example 4, light transmittance for light having a center wavelength of about 430 nm has been significantly reduced when the second inorganic layer having a thickness of about 7 μm has been formed. It is considered that, because Embodiments 2 to 4 have high durability by including the second inorganic layers, respectively, having the properties shown in Table 1, there has been no change in light transmittance due to less damage by light for Embodiments 2 to 4. It is considered that, because the second inorganic layers having low durability are respectively included in Comparative Examples 2 to 4, light transmittance has been reduced due to the second inorganic layers damaged by light. In addition, it is considered that, as the second inorganic layer becomes thicker, a damaged region has become wider and thus the percentage of decrease in light transmittance has become greater.

Hereinafter, the effects of a second inorganic layer IOL2 including the plurality of sub inorganic layers and a display device including the same will be described in detail with reference to FIGS. 5A and 5B, an embodiment, and a comparative example.

Figure 5A:
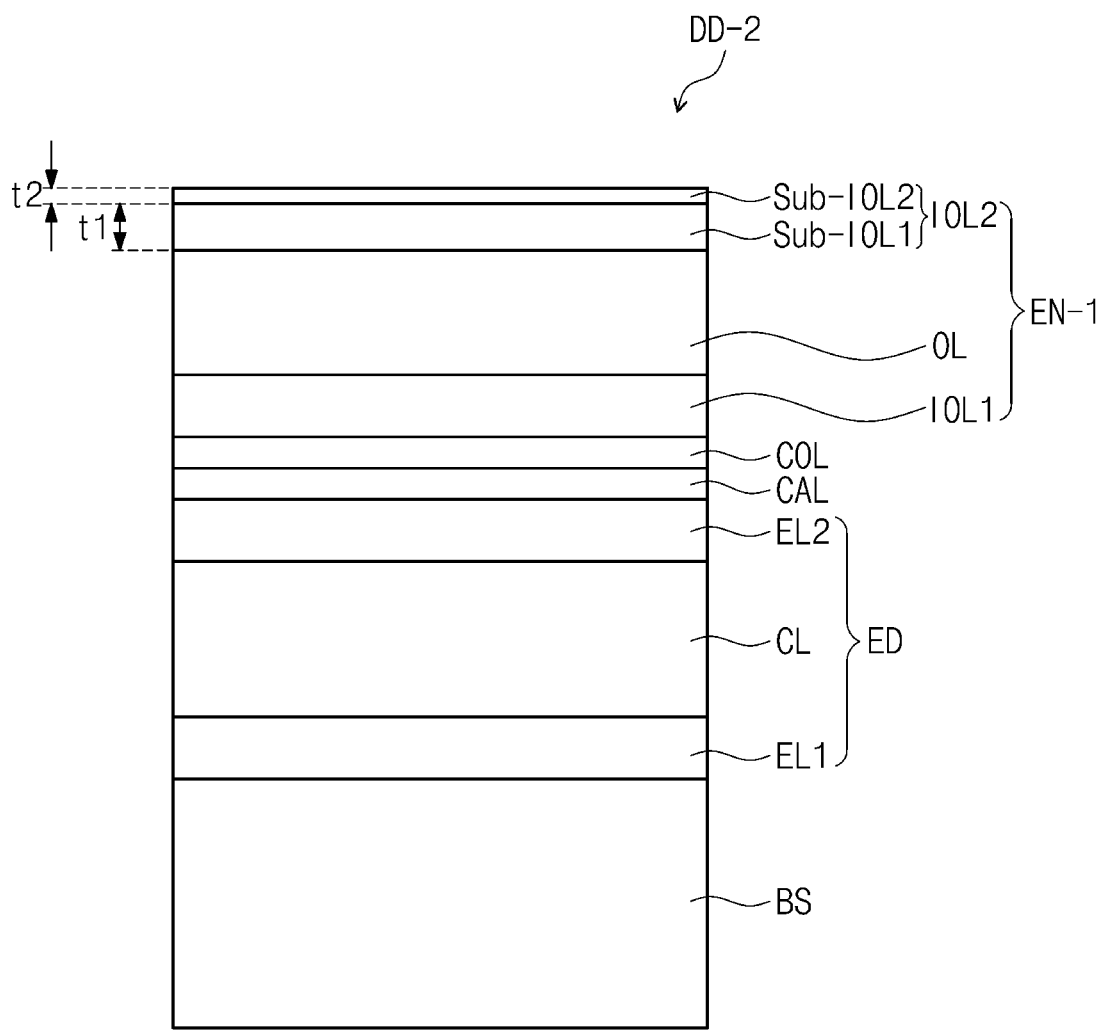
FIG. 5A is a cross-sectional view of a display device according to an example embodiment of the inventive concept.
Figure 5B:
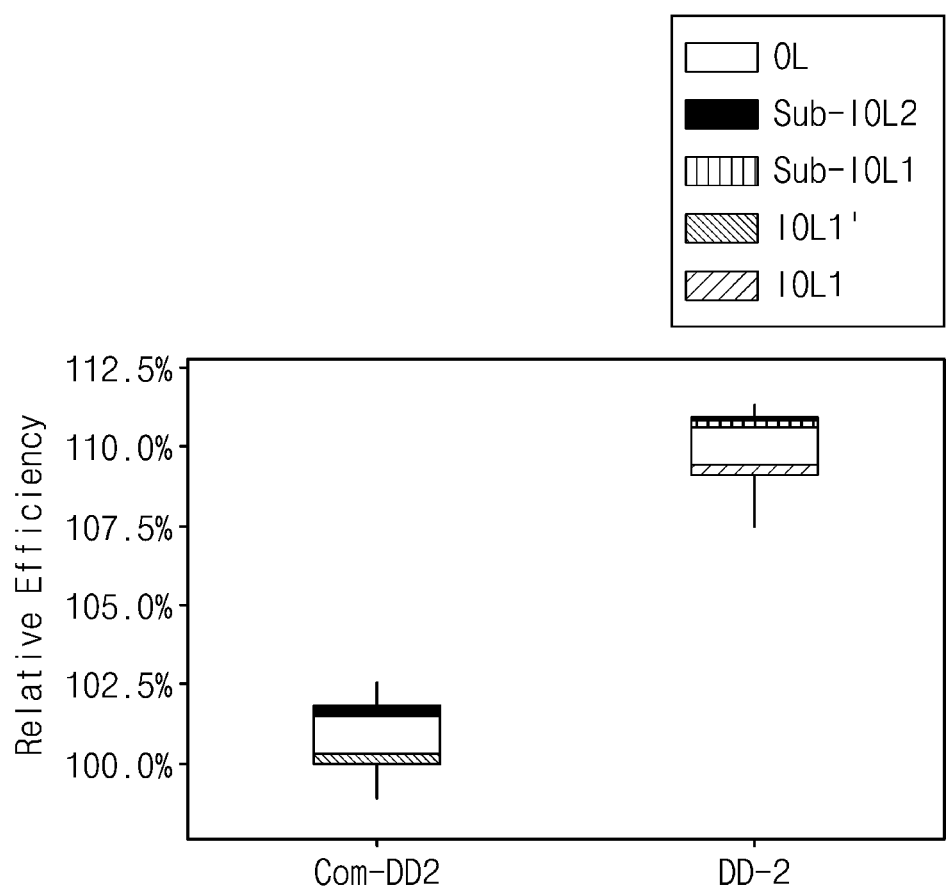
FIG. 5B is a graph showing efficiency of the display device according to an example embodiment of the inventive concept and a display device of a comparative example.

FIG. 5A is a cross-sectional view of a display device DD-2 according to an example embodiment of the inventive concept, and FIG. 5B is a graph showing relative efficiency of the display device DD-2 according to an example embodiment of the inventive concept and a display device Com-DD2 of a comparative example. Hereinafter, a detailed description will not be provided for components that are the same as that of the display device described with reference to FIGS. 1 to 4C.

Referring to FIG. 5A, the display device DD-2 may include a sealing member EN-1, and the sealing member EN-1 may include a second inorganic layer IOL2 including the plurality of sub inorganic layers. The second inorganic layer IOL2 may include a first sub inorganic layer Sub-IOL1 and a second sub inorganic layer Sub-IOL2 the refractive indices and the thicknesses of which are different from each other.

When the second inorganic layer IOL2 includes the two sub inorganic layers Sub-IOL1 and Sub-IOL2, the thickness of the second inorganic layer IOL2 may be from about 0.5 µm to about 1.5 µm. For example, the thickness of the second inorganic layer IOL2 may be from about 0.5 µm to about 1.0 µm.

The first sub inorganic layer Sub-IOL1 may be disposed directly on the organic layer OL. The refractive index of the first sub inorganic layer Sub-IOL1 may be the same as or similar to the refractive index of the first inorganic layer IOL1, and may be, for example, from about 1.58 to about 1.64. Because the first sub inorganic layer Sub-IOL1 is disposed directly on the organic layer OL, the refractive index of the first sub inorganic layer Sub-IOL1 may be controlled similarly to that of the first inorganic layer IOL1 so that the first sub inorganic layer Sub-IOL1 prevents or substantially reduces deterioration of the efficiency of the display device DD-2 and performs a function of a barrier film effectively.

The first sub inorganic layer Sub-IOL1 may be thinner than the first inorganic layer IOL1 and may be thicker than the second sub inorganic layer Sub-IOL2. In an embodiment, the thickness of the first sub inorganic layer Sub-IOL1 may be from about 0.5 µm to about 0.6 µm.

In an embodiment, the first sub inorganic layer Sub-IOL1 may include an inorganic material having a relatively small absorption coefficient and may include, for example, silicon oxynitride (SiON), or silicon oxide (SiO), but is not limited thereto. By adjusting the ranges of the thickness and the refractive index of the first sub inorganic layer Sub-IOL1 and including an inorganic material having a relatively small absorption coefficient in the first sub inorganic layer Sub-IOL1, the amount of light absorbed by the first sub inorganic layer Sub-IOL1 may be minimized or substantially reduced while the first sub inorganic layer Sub-IOL1 may effectively perform a function of a barrier film, so that the decrease in the efficiency of the display device DD-2 may be prevented or substantially reduced.

The second sub inorganic layer Sub-IOL2 may be disposed on the first sub inorganic layer Sub-IOL1. The second sub inorganic layer Sub-IOL2 may be disposed at the top of the sealing member EN-1. A function of preventing oxygen, moisture, foreign matter or the like from flowing into the light emitting element ED is most important in the second sub inorganic layer Sub-IOL2 disposed at the top of the sealing member EN-1. Accordingly, the refractive index of the second sub inorganic layer Sub-IOL2 may be larger than the refractive indices of the first inorganic layer IOL1 and the first sub inorganic layer Sub-IOL1. In an embodiment, the refractive index of the second sub inorganic layer Sub-IOL2 may be from about 1.80 to about 2.00.

A thickness t2 of the second sub inorganic layer Sub-IOL2 may be less than a thickness t1 of the first sub inorganic layer Sub-IOL1. In an embodiment, the thickness t2 of the second sub inorganic layer Sub-IOL2 may be from about 0.1 µm to about 0.2 µm. When the thickness t2 of the second sub inorganic layer Sub-IOL2 is greater than about 0.2 µm, the amount of light absorbed by the second sub inorganic layer Sub-IOL2 may become large because the absorption coefficient of the second sub inorganic layer Sub-IOL2 having a greater refractive index is greater than that of the first sub inorganic layer Sub-IOL1, and thus the efficiency of the display device may decrease.

In an embodiment, the ratio (t1:t2) of the thickness t1 of the first sub inorganic layer Sub-IOL1 to the thickness t2 of the second sub inorganic layer Sub-IOL2 may be from about 3:1 to about 5:1.

Referring to FIG. 5B, a difference in light efficiency of the display device according to the second inorganic layer IOL2 may be seen. The efficiency of the display device is evaluated by measuring a current-voltage-luminance (IVL) characteristic. The display device Com-DD2 of the comparative example has the same configuration as the display device Com-DD1 of the comparative example of FIG. 4B. The display device DD-2 in an embodiment is the same as the display device in FIG. 5A, includes a blue light emitting layer, and includes a sealing member including a first inorganic layer IOL1 having a refractive index of about 1.60, the organic layer OL, a first sub inorganic layer IOL1 having a refractive index of about 1.60, and a second sub inorganic layer IOL2 having a refractive index of about 1.90. When the efficiency of the display device Com-DD2 of the comparative example is taken as 100%, the display device DD-2 according to an embodiment has an efficiency of about 109.1%, about 9.1% higher when compared with the display device of the comparative example. This improvement of efficiency is greater than in the display devices DD-1 and DD-1' according to an embodiment of FIGS. 4B and 4C, and it is considered that the efficiency of the display device DD-2 is further improved as the thickness of the second sub inorganic layer Sub-IOL2 having a refractive index of about 1.90 is reduced to decrease the amount of light absorbed by the second sub inorganic layer Sub-IOL2. Accordingly, the display device DD-2 according to an example embodiment of the inventive concept may have improved efficiency by including the first sub inorganic layer Sub-IOL1 and the second sub inorganic layer Sub-IOL2 the refractive indices and the thicknesses of which are controlled.

In an embodiment, the second sub inorganic layer Sub-IOL2 may include an inorganic material having a relatively large absorption coefficient, and may include any one of, for example, silicon nitride, aluminum oxide, and titanium oxide.

Figure 6A:
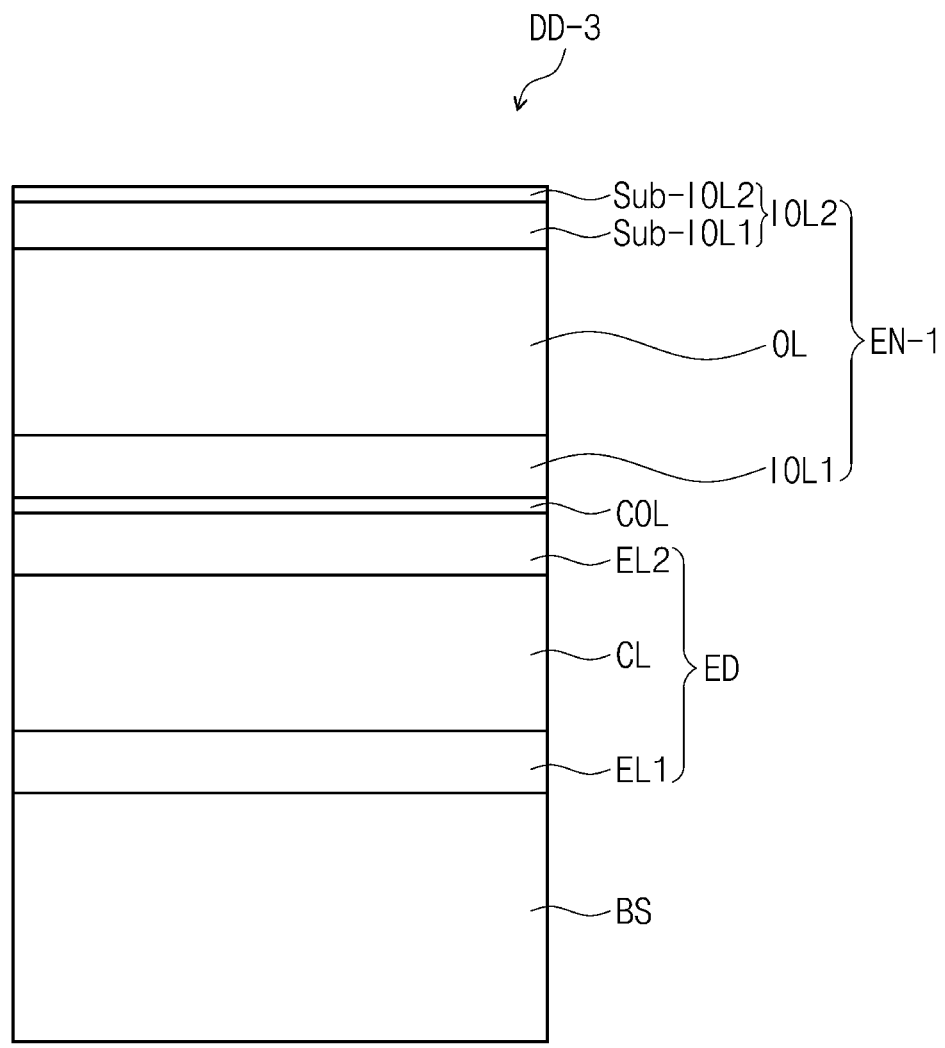
FIGS. 6A-6C are cross-sectional views of display devices according to an example embodiment of the inventive concept.
Figure 6B:
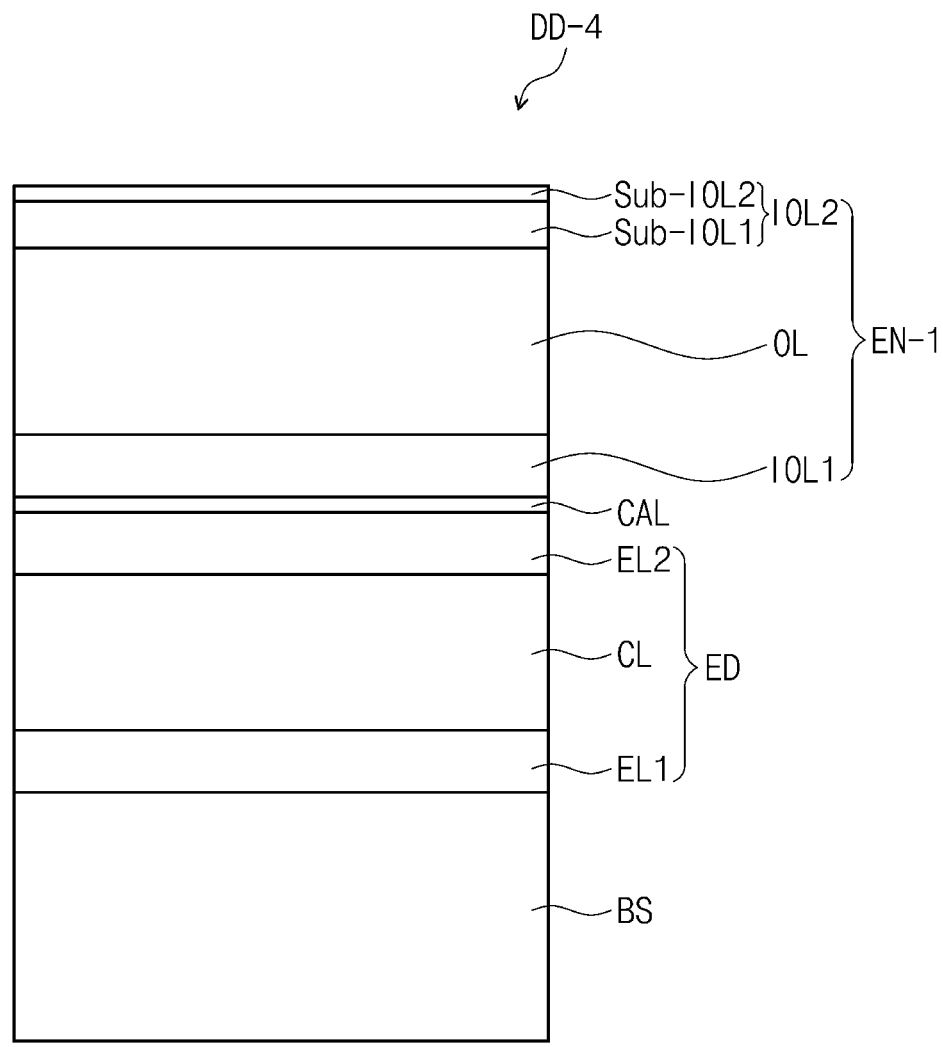
Figure 6C:
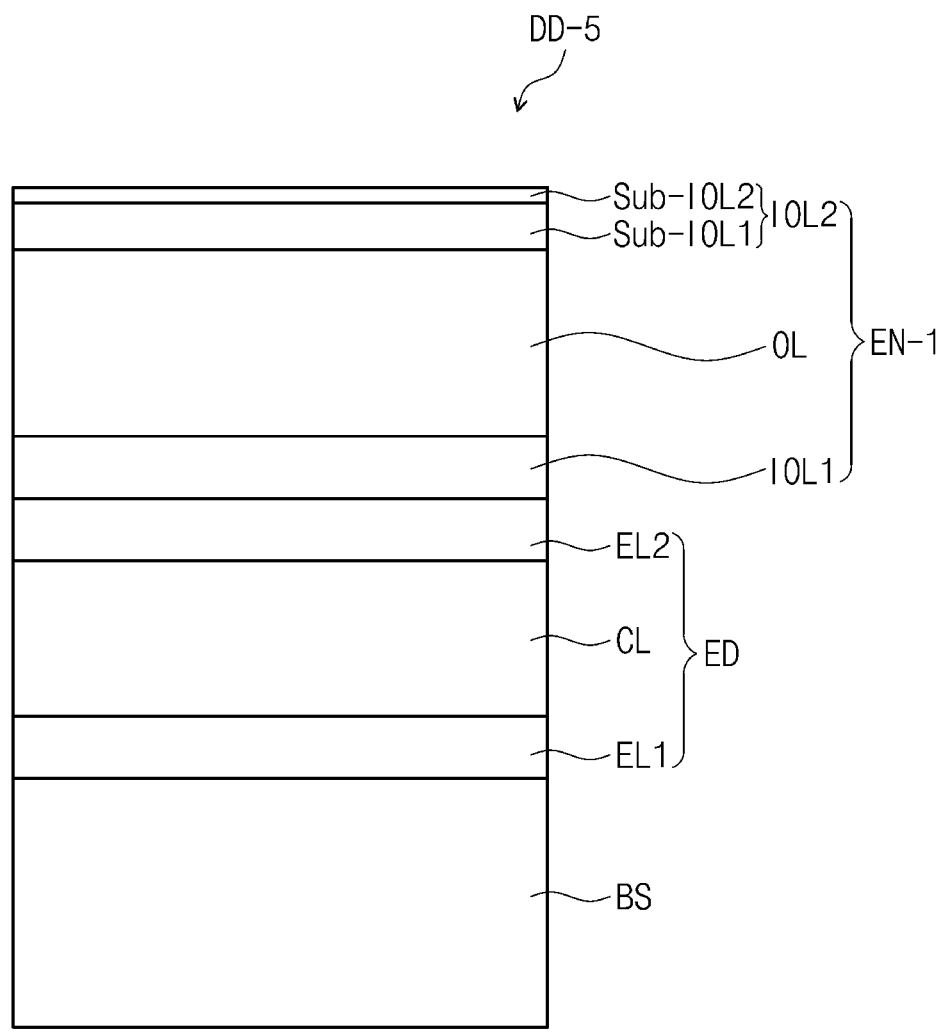

FIGS. 6A to 6C are cross-sectional views of display devices according to an example embodiment of the inventive concept. Hereinafter, a detailed description will not be provided for components that are the same as that of the display device described with reference to FIGS. 1 to 5B.

Referring to FIG. 6A, a display device DD-3 may include the cover layer COL disposed between the light emitting element ED and the sealing member EN-1. The cover layer COL may be disposed directly on the light emitting element ED, and the sealing member EN-1 may be disposed directly on the cover layer COL.

Referring to FIG. 6B, a display device DD-4 may include the capping layer CAL disposed between the light emitting element ED and the sealing member EN-1. The capping layer CAL may be disposed directly on the light emitting element ED, and the sealing member EN-1 may be disposed directly on the capping layer CAL.

Referring to FIG. 6C, a display device DD-5 may include the sealing member EN-1 disposed directly on the light emitting element ED. In this case, the display device DD-5 may not include the cover layer and the capping layer.

Figure 7A:
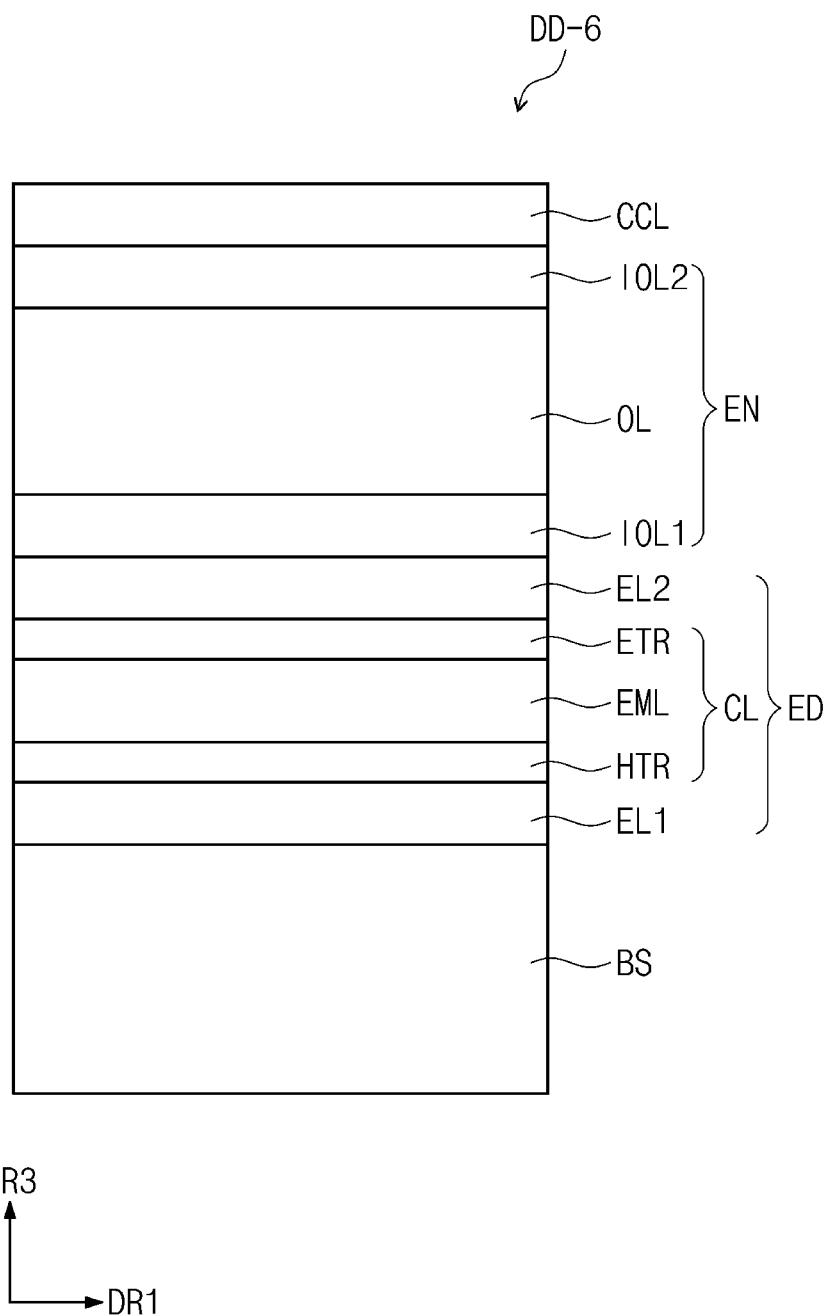
FIGS. 7A-7B are cross-sectional views of a display device according to an example embodiment of the inventive concept.
Figure 7B:
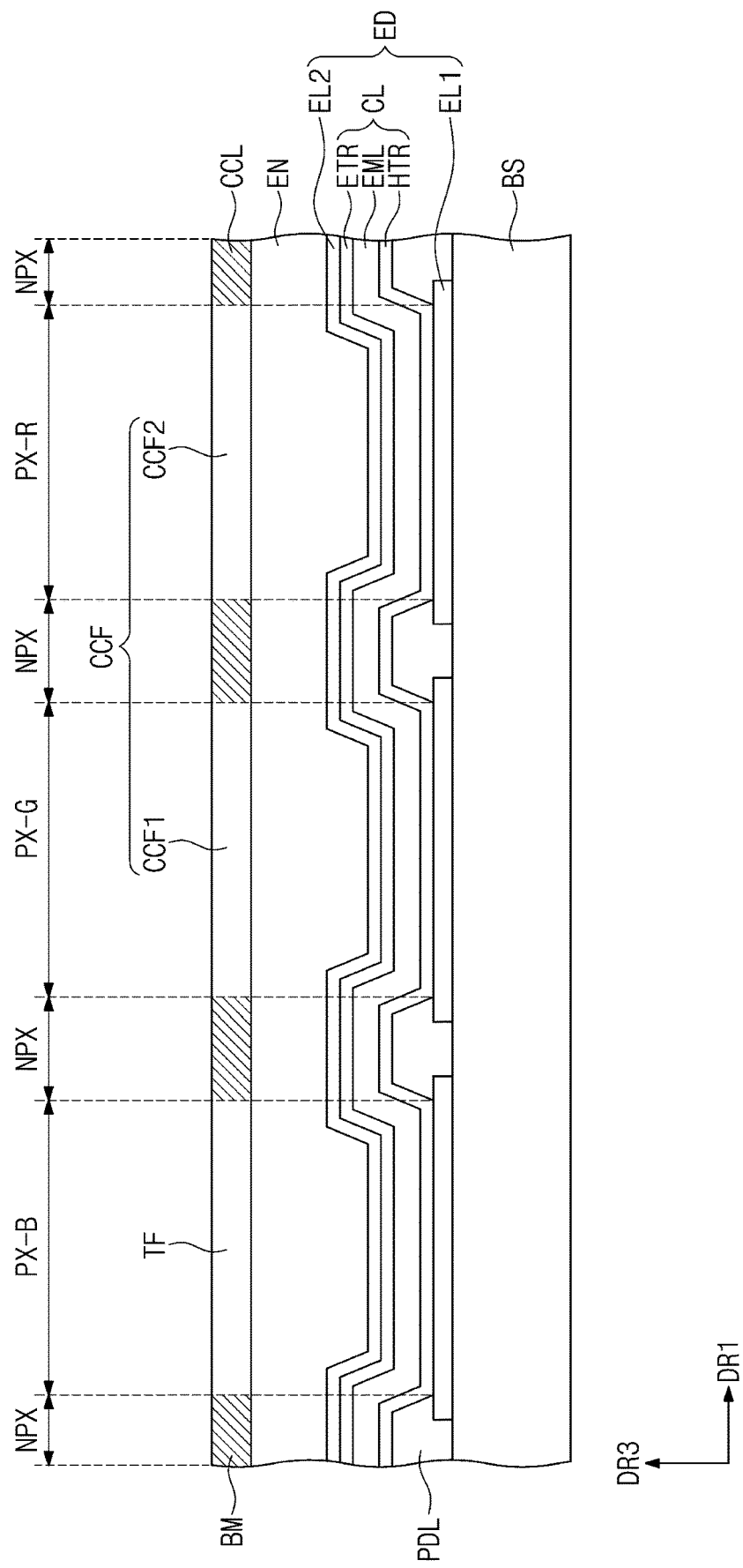

FIGS. 7A and 7B are cross-sectional views of a display device including a color control layer CCL according to an example embodiment of the inventive concept. FIG. 7B illustrates three pixel regions PX-R, PX-G, and PX-B according to an embodiment corresponding to FIG. 7A. Hereinafter, a detailed description will not be provided for components that are the same as that of the display device described with reference to FIGS. 1 to 6C.

Referring to FIG. 7A, a display device DD-6 may further include the color control layer CCL disposed on the sealing member EN. The capping layer CAL and/or the cover layer COL may be included between the light emitting element ED and the sealing member EN.

Referring to FIG. 7B, the light emitting layer EML may be disposed to overlap all of first to third pixel regions PX-R, PX-G, and PX-B, and may have an integral shape (e.g., be formed as a single continuous and monolithic layer). The light emitting layer EML may provide the same blue light.

Although illustrated to include a single intermediate layer CL in FIG. 7B, the light emitting element ED is not limited thereto and may also include an intermediate layer CL of multilayer structure referred to as a tandem. For example, the light emitting element may include a first intermediate layer, a second intermediate layer, and a third intermediate layer, and, in this case, the light emitting layer may have a structure of a blue light emitting layer/a blue light emitting layer/a blue light emitting layer, or the like.

The color control layer CCL may include a transmission filter TF and a color conversion member CCF corresponding to the first pixel region PX-B, the second pixel region PX-G, and the third pixel region PX-R. In this embodiment, a color control layer CCL including one transmission filter TF and two color conversion members CCF1 and CCF2 is exemplarily illustrated so as to correspond to the three pixel regions.

The transmission filter TF may be disposed to correspond to the first pixel region PX-B. The transmission filter TF does not include a light emitting body and may transmit light provided from the light emitting layer EML. The transmission filter TF may include a transparent polymer resin, and may further include at least one of a blue pigment and a blue dye to improve color purity.

A first color conversion member CCF1 and a second color conversion member CCF2 may be disposed to correspond to the second pixel region PX-G and the third pixel region PX-R respectively, and may absorb light beams provided from the light emitting layer EML to emit light beams of different colors. The first color conversion member CCF1 and the second color conversion member CCF2 may include a light emitting body, and the light emitting body may include a quantum dot.

A light blocking portion BM may be disposed between the transmission filter TF and the first color conversion member CCF1 disposed apart from each other, and between the first color conversion member CCF1 and the second color conversion member CCF2 disposed apart from each other. The light blocking portion BM may be formed by including an organic light blocking material or an inorganic light blocking material including a black pigment or dye. The light blocking portion BM may overlap a peripheral region NPX. The light blocking portion BM may prevent or substantially prevent a light leakage phenomenon and define boundaries between the transmission filter TF and the color conversion members CCF1 and CCF2, next to each other. However, the light blocking portion BM may be omitted, and the color conversion member CCF may be directly disposed.

According to the display device according to an embodiment of the inventive concept, the display device with improved efficiency may be provided.

According to the display device according to an embodiment of the inventive concept, foreign matter such as oxygen or moisture may be effectively blocked from flowing into the display device from the outside, and the reliability of the display device may be enhanced.

Although the exemplary embodiments of the inventive concept have been described herein, it is understood that various changes and modifications can be made by those skilled in the art within the spirit and scope of the inventive concept defined by the following claims and equivalents thereof.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art. Further, a specific quantity or range recited in this written description or the claims may also encompass the inherent variations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification.

As used herein, the terms "use," "using," and "used" may be considered synonymous with the terms "utilize," "utilizing," and "utilized," respectively.

The display device and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the display device may be formed on one integrated circuit (IC) chip or on separate IC chips. Further, the various components of the display device may be implemented on a flexible printed circuit film, a tape carrier package (TCP), a printed circuit board (PCB), or formed on a same substrate. Further, the various components of the display device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Therefore, the scope of the inventive concept is to be determined by the broadest permissible interpretation of the following claims and their equivalents, and shall not be restricted or limited by the foregoing detailed description.

What is claimed is:

1. A display device comprising:
a light emitting element; and
a sealing member on the light emitting element and sealing the light emitting element,
wherein the sealing member comprises:
a first inorganic layer on the light emitting element and having a refractive index of 1.58 to 1.64;
an organic layer on the first inorganic layer; and
a second inorganic layer on the organic layer and having a refractive index of 1.58 to 2.00.

2. The display device of claim 1, wherein a thickness of the first inorganic layer is 0.5 µm to 1.5 µm.

3. The display device of claim 1, wherein the first inorganic layer comprises at least one of silicon oxynitride, silicon nitride, and silicon oxide.

4. The display device of claim 1, wherein a thickness of the second inorganic layer is 0.5 µm to 1.5 µm.

5. The display device of claim 1, wherein the second inorganic layer comprises two or more sub inorganic layers having refractive indices different from each other.

6. The display device of claim 1, wherein the second inorganic layer comprises a first sub inorganic layer having a refractive index of 1.58 to 1.64, and a second sub inorganic layer having a refractive index of 1.80 to 2.00.

7. The display device of claim 6, wherein a ratio of a thickness of the first sub inorganic layer to a thickness of the second sub inorganic layer is 3:1 to 5:1.

8. The display device of claim 7, wherein the thickness of the first sub inorganic layer is 0.5 µm to 0.6 µm.

9. The display device of claim 7, wherein the thickness of the second sub inorganic layer is 0.1 µm to 0.2 µm.

10. The display device of claim 6, wherein the first sub inorganic layer comprises silicon oxynitride or silicon oxide.

11. The display device of claim 6, wherein the second sub inorganic layer comprises at least one of silicon nitride, aluminum oxide, and titanium oxide.

12. The display device of claim 6, wherein the second sub inorganic layer is at a top of the sealing member.

13. The display device of claim 1, wherein the second inorganic layer comprises silicon nitride that does not comprise a Si—O bond, and has a thickness of 0.15 µm to 0.25 µm.

14. The display device of claim 13, wherein a hydrogen content of the second inorganic layer is less than or equal to $2.8 \times 10^{22}$ atom/cm$^3$.

15. The display device of claim 13, wherein a molar ratio of nitrogen to silicon is 1 to 1.3 for an entirety of the second inorganic layer.

16. The display device of claim 13, wherein the second inorganic layer has a density of 2.3 g/cm$^3$ to 2.6 g/cm$^3$.

17. The display device of claim 1, wherein the light emitting element comprises:
a first electrode;
a second electrode on the first electrode; and
an intermediate layer between the first electrode and the second electrode, and comprises a light emitting layer having at least one of an organic light emitting material and a quantum dot light emitting material.

18. The display device of claim 1, further comprising a capping layer between the light emitting element and the sealing member.

19. The display device of claim 18, further comprising a cover layer between the capping layer and the sealing member and has a refractive index of 1.3 to 1.4.

20. The display device of claim 1, further comprising a color control layer on the sealing member and comprises a quantum dot.

21. A display device comprising:
a light emitting element;
a first inorganic layer on the light emitting element and has a first thickness;
an organic layer on the first inorganic layer; and
a second inorganic layer on the organic layer,
wherein the second inorganic layer comprises a first sub inorganic layer having a second thickness less than the first thickness, and a second sub inorganic layer on the first sub inorganic layer and has a third thickness less than the second thickness.

22. The display device of claim 21, wherein a ratio of the second thickness to the third thickness is 3:1 to 5:1.

23. The display device of claim 21,
wherein the first inorganic layer has a first refractive index,
wherein the first sub inorganic layer has a second refractive index, and
wherein the second sub inorganic layer has a third refractive index greater than the first refractive index and the second refractive index.

24. The display device of claim 23, wherein the first refractive index is 1.58 to 1.64.

25. The display device of claim 23, wherein the second refractive index is 1.58 to 1.64, and the third refractive index is 1.80 to 2.00.

26. A display device comprising:
a light emitting element; and
a sealing member on the light emitting element and sealing the light emitting element,
wherein the sealing member comprises:
a first inorganic layer;
an organic layer on the first inorganic layer; and
a second inorganic layer on the organic layer, and
wherein the second inorganic layer
comprises silicon nitride that does not comprise a Si—O bond,
has a thickness of 0.15 μm to 0.25 μm,
has a molar ratio of nitrogen to silicon of 1 to 1.3 for an entirety of the second inorganic layer, and
has a hydrogen content less than or equal to $2.8 \times 10^{22}$ atom/cm$^3$.

27. The display device of claim 26, wherein the second inorganic layer has a density of 2.3 g/cm$^3$ to 2.6 g/cm$^3$.

28. The display device of claim 26, wherein a refractive index of the first inorganic layer is 1.58 to 1.64, and a refractive index of the second inorganic layer is 1.58 to 2.00.

* * * * *